United States Patent [19]

Spyrou

[11] Patent Number: 5,555,187

[45] Date of Patent: Sep. 10, 1996

[54] METHOD AND APPARATUS FOR DETERMINING THE TIMING SPECIFICATION OF A DIGITAL CIRCUIT

[75] Inventor: Athanasius W. Spyrou, San Jose, Calif.

[73] Assignee: VLSI Technology, Inc., San Jose, Calif.

[21] Appl. No.: 366,701

[22] Filed: Dec. 30, 1994

[51] Int. Cl.⁶ .............................. G06F 17/50; G06F 19/00
[52] U.S. Cl. ......................... 364/490; 364/488; 364/491
[58] Field of Search ................................... 364/488, 489, 364/490, 491, 578; 371/23, 27

[56] References Cited

U.S. PATENT DOCUMENTS

| | | | |
|---|---|---|---|
| 4,744,084 | 5/1988 | Beck et al. | 371/23 |
| 4,763,289 | 8/1988 | Barzilai et al. | 364/578 |
| 4,937,827 | 6/1990 | Beck et al. | 371/23 |
| 5,095,454 | 5/1992 | Huang | 364/578 |
| 5,325,309 | 6/1994 | Halaviati et al. | 364/488 |
| 5,333,032 | 7/1994 | Matsumoto et al. | 364/489 |
| 5,383,167 | 1/1995 | Weil | 364/488 |
| 5,426,591 | 6/1995 | Ginetti et al. | 364/489 |
| 5,428,626 | 6/1995 | Frisch et al. | 371/27 |

*Primary Examiner*—Kevin J. Teska
*Assistant Examiner*—Russell W. Frejd
*Attorney, Agent, or Firm*—Irell & Manella

[57] ABSTRACT

The invention accepts user input that describes the circuit elements of a digital circuit and the interconnections between those elements. Based upon the user input, the invention computes the maximum setup and hold times for each data input of the integrated circuit. First, maximum and minimum delays from the clock inputs to the storage elements on the integrated circuit. Similarly, the maximum and minimum delays from the data inputs of the integrated circuit to each level one storage element are determined where a level one storage element is defined as a storage element that has no other storage elements interposed between it and a data input. For each data input/level one storage element pair, the setup time is computed based upon the previously calculated maximum data delay and minimum clock delay and the required setup time for the element. The desired setup time for a data input is the maximum setup time over all the level one storage elements coupled to that data input. Hold times are similarly determined except that the hold time is based upon the previously calculated maximum clock delay and minimum data delay and the required hold time for the element.

20 Claims, 6 Drawing Sheets

METHOD AND APPARATUS FOR DETERMINING THE TIMING SPECIFICATION OF A DIGITAL CIRCUIT

BACKGROUND OF THE INVENTION

1. Field of the Invention

The invention relates to digital circuits, and more particularly, to a method and apparatus for determining the timing specification for a digital integrated circuit.

2. Art Background

Digital circuits are rapidly increasing in complexity. Very Large Scale Integration ("VLSI") integrated circuits may contain thousands of circuit elements and a correspondingly large number of circuit connections. Despite this complexity, integrated circuit manufacturers must determine the specifications of their integrated circuits because the integrated circuits interact with other elements in a digital system. For example, a central processing unit (CPU) may interact with a random access memory (RAM) and a computer manufacturer must have accurate timing specifications for both. The complexity of modern digital circuits renders the determination of integrated circuit specifications a time consuming and difficult process.

Prior art techniques to determine the timing specification of a integrated circuit require a relatively large number of man hours. For example, a person using a static path tracing tool must manually trace and evaluate each path in a digital circuit, where a single path is defined as the circuit elements that process a particular input at an input pin to generate an output at an output pin. Further, subsidiary paths, such as a path from an input pin to a flip flop data input, must also be analyzed. Since the number of total paths on modern digital circuits is extremely large, determining a integrated circuit specification with a static path tracing tool requires a relatively large amount of time.

More specifically, with regard to synchronous circuits, "setup" and "hold" times must be specified for a integrated circuit. In synchronous circuits, the circuit elements are coupled to a digital clock input that controls the timing of data operations. There is a delay from the clock input to a particular circuit element and circuit elements in synchronous circuits will not process data until they receive the clock pulse. Most circuit elements require a data input a finite amount of time before receiving a clock pulse. This amount of time is typically referred to as the "setup" time. Also, most circuit elements require the data to be maintained for a certain amount of time after the clock input changes from a low value to a high value. This amount of time is known as the "hold" time.

The circuit must ensure that the setup and hold times for each data element are satisfied. To ensure that the setup and hold times for each element are satisfied, the data input and the clock input must be maintained at a certain element for the proper length of time. The required length of time that a data or clock value must be maintained depends upon the lag between the clock and data input to a certain element and the required setup and hold times for that particular element. According to the prior art, the required maintenance time for data and clock inputs to a integrated circuit is determined manually. As previously described, this is a time consuming process, particularly for large and complex integrated circuits.

The method and apparatus of the present invention overcomes the limitations of the prior art, and automatically determines the setup and hold times for a integrated circuit based upon user specified parameters of a circuit.

SUMMARY OF THE INVENTION

The present invention accepts user input that describes the circuit elements of a digital circuit and the interconnections between those elements. Based upon the user input, the invention computes the maximum setup and hold times for each data input of the integrated circuit. In the preferred embodiment, a graph of the circuit is generated and used to determine the maximum and minimum delays from the clock inputs to the storage elements on the integrated circuit. Similarly, the maximum and minimum delays from the data inputs of the integrated circuit to each level one storage element is determined. A level one storage element is defined as a storage element that has no other storage elements interposed between it and a data input.

For each data input/level one storage element pair, the setup time is computed based upon the previously calculated maximum data delay and minimum clock delay and the required setup time for the element. The desired setup time for a data input is the maximum setup time over all the level one storage elements coupled to that data input. Hold times are similarly determined. For each data input/level one storage element pair, the hold time is computed based upon the previously calculated maximum clock delay and minimum data delay and the required hold time for the element. The desired hold time for a data input is the maximum hold time over all the level one storage elements coupled to that data input. Thus, the desired setup and hold times are determined automatically.

NOTATION AND NOMENCLATURE

Figure 1:
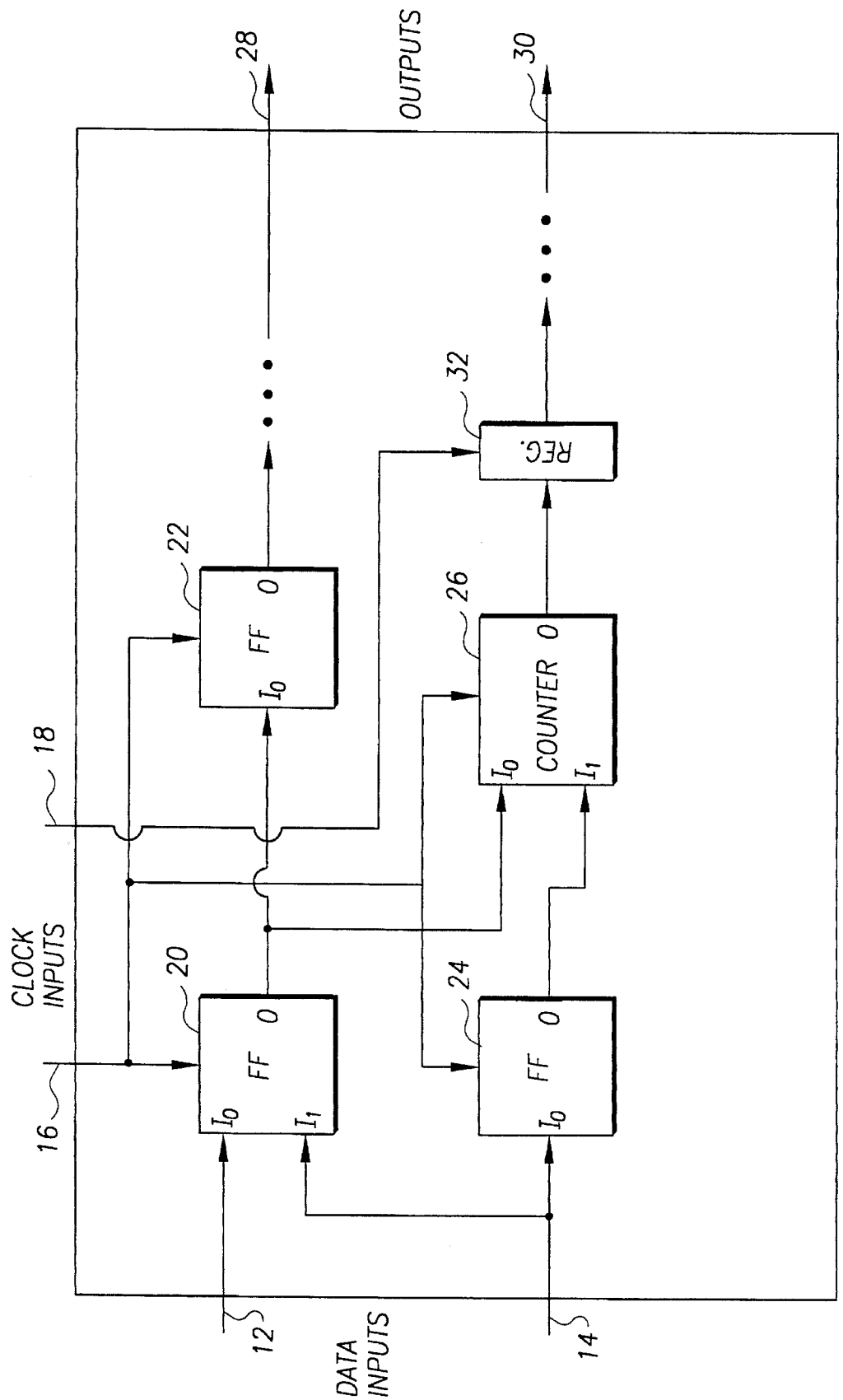
FIG. 1 is a block diagram of an exemplary digital circuit that is to have its timing specification determined according to the methods and apparatus of the present invention.

The detailed descriptions which follow are presented largely in terms of algorithms and symbolic representations of operations on data bits within a computer memory. These descriptions and representations are the means used by those skilled in the data processing arts to most effectively convey the substance of their work to others skilled in the art.

An algorithm is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar digital devices. In all cases there should be borne in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer or other apparatus. In particular, various general purpose machines may be used with programs written in accordance with the teachings herein, or it may prove more convenient to construct more specialized apparatus to perform the required method steps. The required structure for a variety of these machines will appear from the description given below.

DETAILED DESCRIPTION OF THE INVENTION

The present invention discloses methods and apparatus for automatically determining the integrated circuit timing for a digital circuit. Although the present invention is described with reference to specific block diagrams, and signals, etc., it will be appreciated by one of ordinary skill in the art that such details are disclosed simply to provide a more thorough understanding of the present invention. It will therefore be apparent to one skilled in the art that the present invention may be practiced without these specific details. In other instances, well known circuits are shown in block diagram form in order not to obscure the present invention unnecessarily.

FIG. 1 is a block diagram of a portion of an exemplary synchronous digital circuit 10. The diagram of FIG. 1 is for purposes of illustration and in practice, a digital circuit which is analyzed using the methods and apparatus of the present invention will typically be more complicated than that depicted in FIG. 1. The method and apparatus of the present invention determines the timing specification of the circuit 10 illustrated in FIG. 1.

As illustrated in the figure, the digital circuit 10 includes data inputs 12 and 14 that are transformed by the circuit into data outputs 28 and 30. Circuit elements including flip flops 20, 22 and 24, a counter 26, and a shift register 32 transform the data inputs 12 and 14 into the data outputs 28 and 30. The method and apparatus of the present invention will operate on digital circuits with any type of circuit elements, including those not depicted in FIG. 1.

The digital circuit of FIG. 1 is synchronous. The circuit elements 20, 22, 24, 26 and 32 are coupled to digital clock inputs 16 and 18 that control the timing of data operations. Since various circuit elements may be interposed between a clock input and a storage element, there is a delay from the clock input to a particular storage element and storage elements in synchronous circuits will not process data until they receive the clock pulse. Most circuit elements require a data input a finite amount of time before receiving a clock pulse. This amount of time is typically referred to as the "setup" time. Also, most circuit elements require the data to be maintained for a certain amount of time after the clock input changes from a low value to a high value. This amount of time is known as the "hold" time.

The length of the pulses of the data and clock signals must be adjusted to ensure that the setup and hold times for each data element are satisfied. Thus, the data input and the clock input must arrive and be maintained at a certain element for the proper length of time. If the worst case (maximum) setup and hold times are satisfied for a integrated circuit, then all of the setup and hold times will be satisfied for the integrated circuit. The method and apparatus of the present invention automatically determines the worst case setup and hold times for a integrated circuit.

According to the present invention, maximum and minimum data transfer delays between nodes of the circuit of FIG. 1 must be calculated. In the preferred embodiment, the method for determining maximum and minimum delays between nodes of a circuit based upon a graph structure is derived from S. Yen, D. Du, S. Ghanta, "Efficient Algorithms for Extracting the K Most Critical Paths in Timing Analysis," Design Automation Conference, 1989 pp. 649–653, which is herein incorporated by reference.

Figure 2:
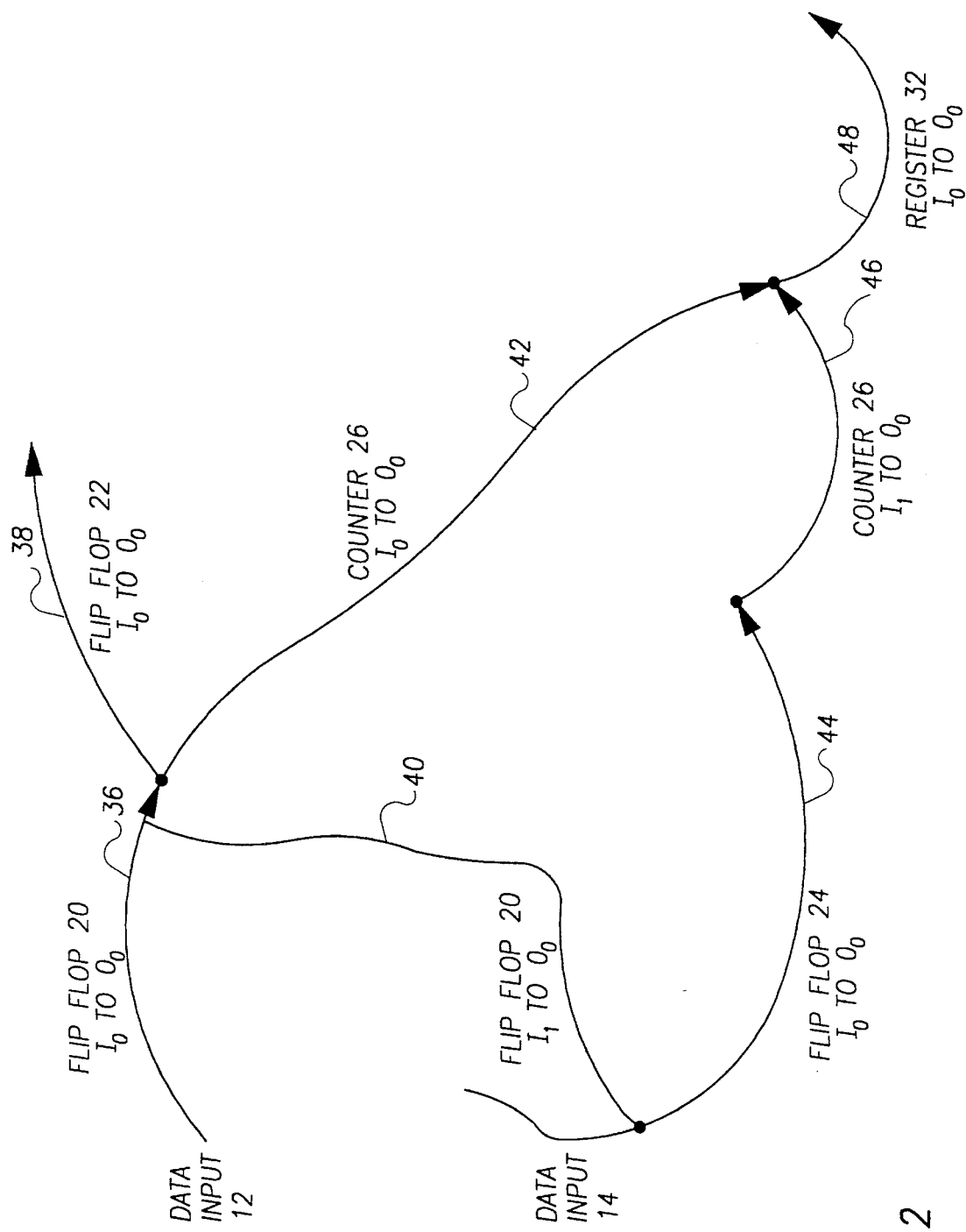
FIG. 2 is a "graph" of the circuit of FIG. 1.

FIG. 2 is a circuit graph of the circuit of FIG. 1. Each node in the graph represents a node of the circuit 10 of FIG. 1 and arcs 36, 38, 40, 42, 44, 46 and 48 between the nodes represent the delay caused by circuit elements between the nodes. Thus, as illustrated in FIG. 2, arc 36 represents the delay from the data input 12 to the output of the flip flop 20 and arc 40 represents the delay from the data input 14 to the output of flip flop 20. Similarly, arc 38 represents the delay across flip flop 22 and arc 42 represents the delay from the output of flip flop 20 across the counter 26. Arcs 44, 46 and 48 respectively, represent the delay across the flip flop 24, the counter 26 and the register 32. As previously described, the algorithm disclosed in "Efficient Algorithms for Extracting the K Most Critical Paths in Timing Analysis" is utilized to calculate maximum and minimum data transfer delays between nodes, which is part of the method of the present invention as will be described in this Specification.

In a general purpose computer, the graph of FIG. 2 may be implemented with a tree data structure. For an example of a tree data structure, see Wirth, Algorithms+Data Structures=Programs (Prentice Hall 1976) pp. 189–257, which is herein incorporated by reference.

Figure 3A:
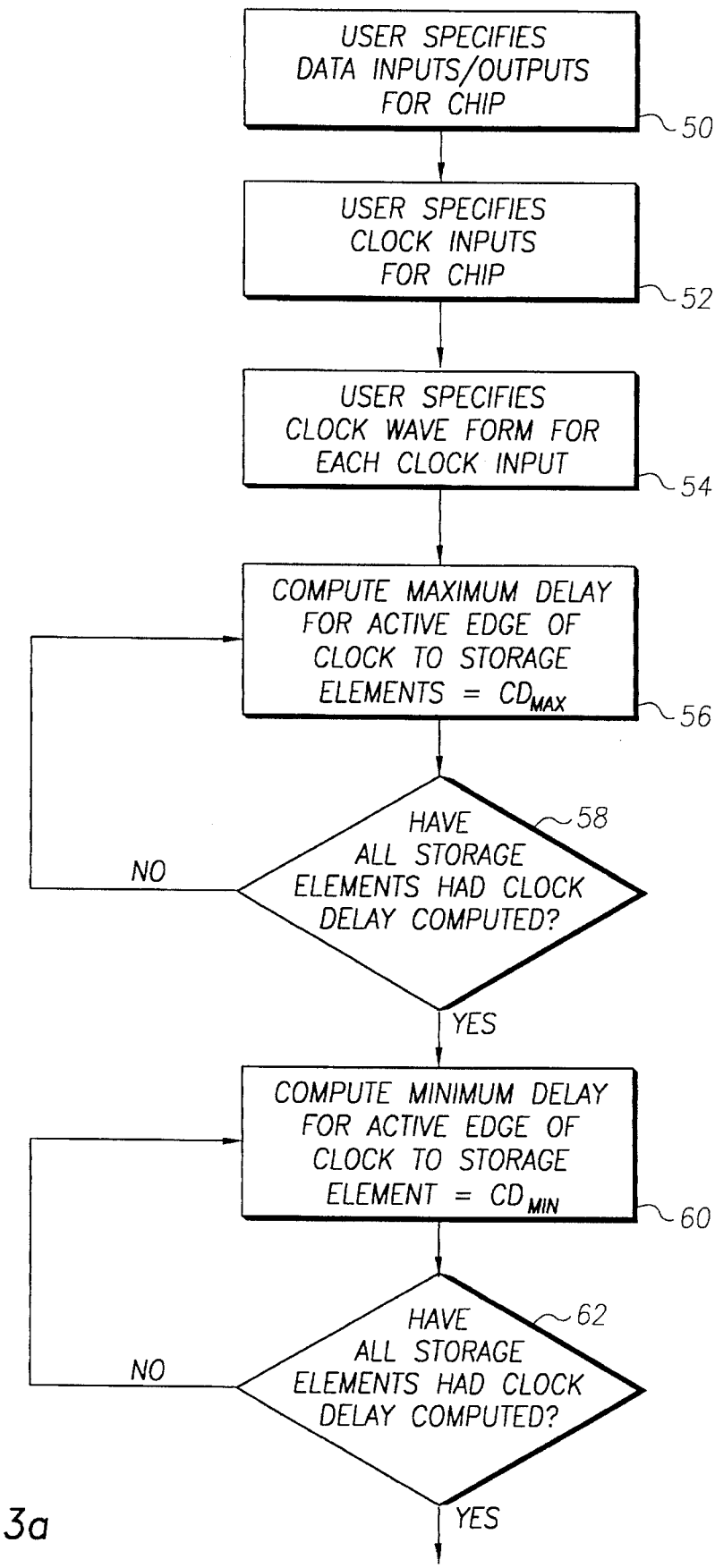
FIGS. 3a–3d are a flow chart of the integrated circuit timing determination method of the present invention.

FIGS. 3a–3d are a flow chart of the method of the present invention. As shown in FIG. 3a at block 50, a user inputs the elements 20, 22, 24, 26 and 32 of the circuit 10, including the parameters of these elements, and the connections between the elements, including data inputs 12 and 14 and data outputs 28 and 30. At block 52, the user inputs the clock inputs 16 and 18 for the circuit 10 and at block 54, the user inputs the clock waveforms for each clock input 16 and 18.

After the user inputs the description of the circuit 10, the maximum delay for the propagation of a clock signal to a storage element is determined for each storage element, as illustrated in blocks 56 and 58. In the preferred embodiment, the circuit 10 is transformed into the graph illustrated in FIG. 2, and a breadth first search is used to determine the maximum path delays according to the methods described in the paper "Efficient Algorithms for Extracting the K Most Critical Paths in Timing Analysis," as previously described. Similarly, as illustrated in blocks 60 and 62, the minimum path delay for the active edge of the clock from each clock input connector to each clock pin of the storage devices of FIG. 1 is determined. In the preferred embodiment, a breadth first search is used for this determination.

Figure 3B:
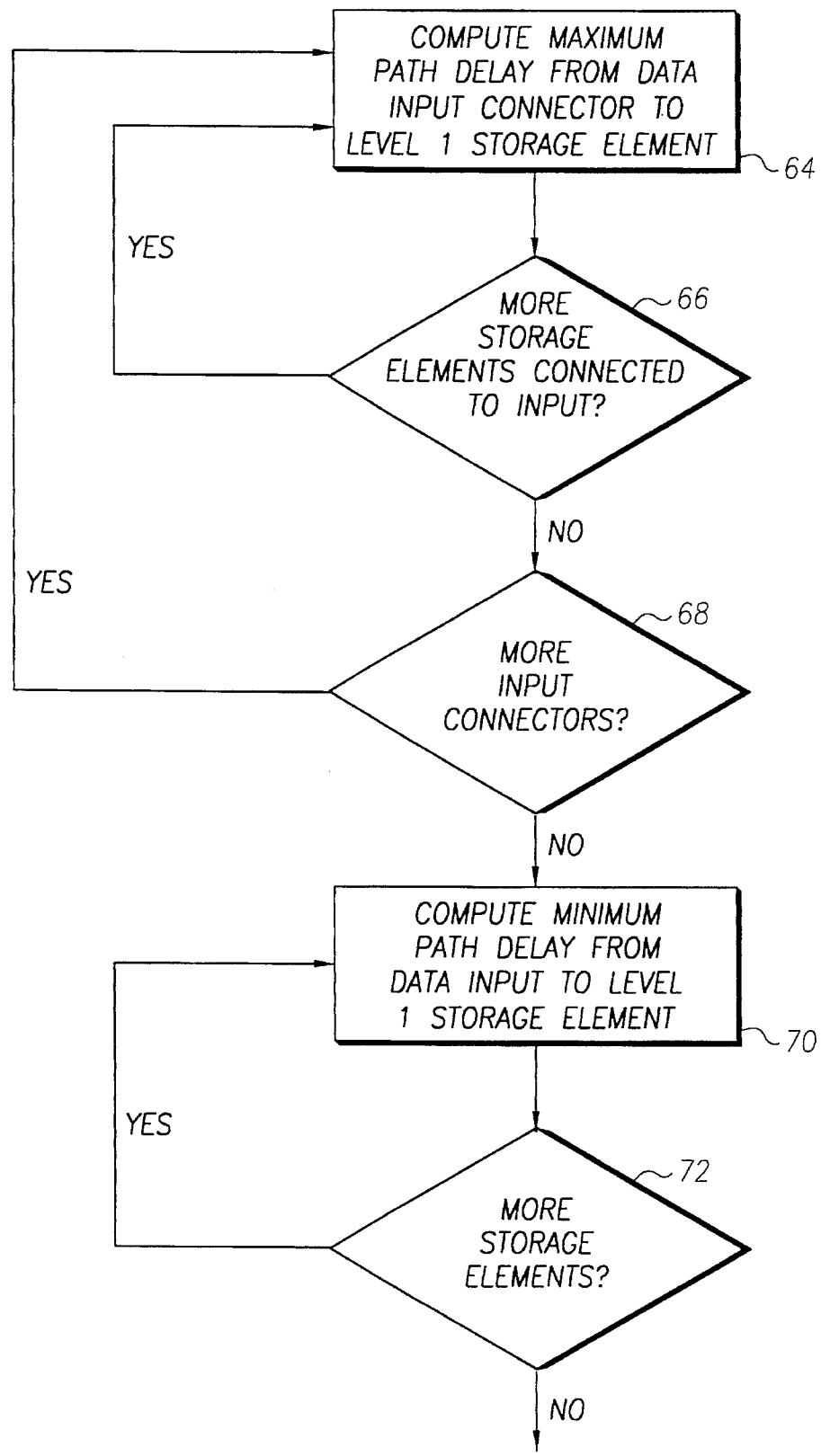

Next, as illustrated in blocks 64–68 of FIG. 3b, the maximum path delay from each data input connector 12 and 14 to each storage element that is a level one storage element is computed. In the preferred embodiment, a breadth first search is used to make this determination. A level one storage element is a storage element that does not have any other storage elements interposed between it and a data input. Thus, in the circuit of FIG. 1 the flip flops 20 and 24 are level one storage elements. A level one storage element may have more than one data input and may have logic gates interposed between it and a data connector as long as the logic gates do not comprise storage elements.

Figure 3C:
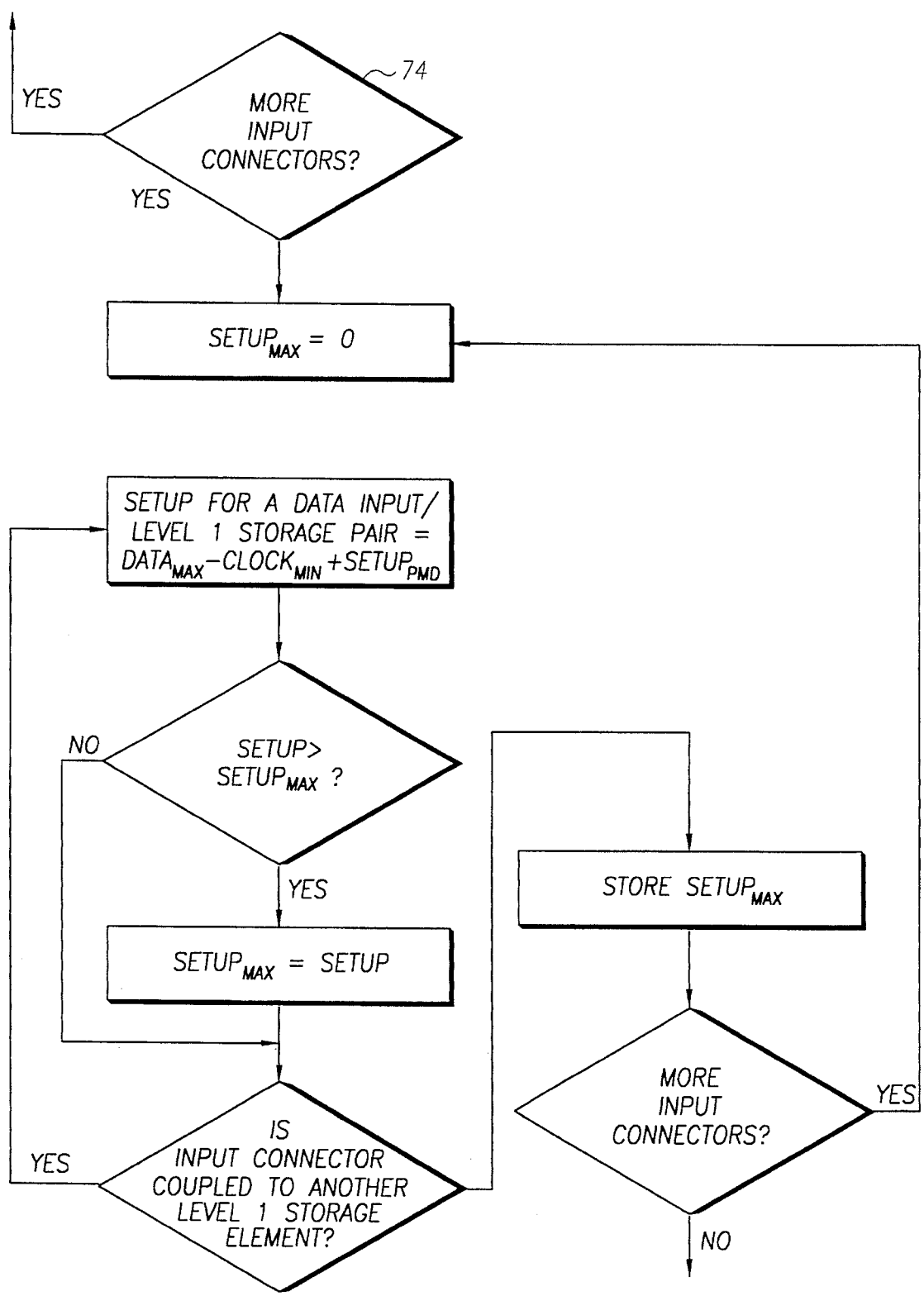
Figure 3D:
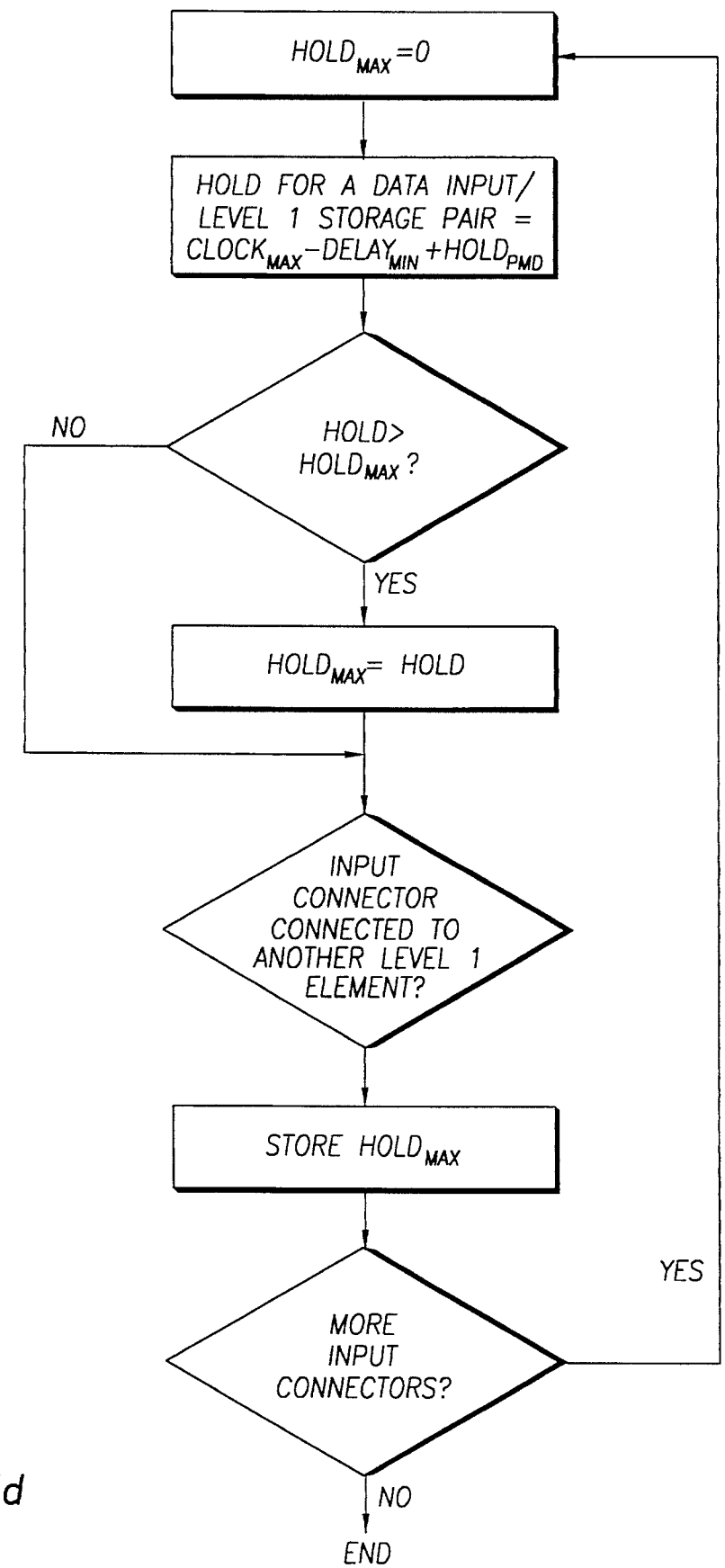

Similarly, as illustrated in blocks 70 and 72 of FIG. 3b and block 74 of FIG. 3c, the minimum path delay from each data input connector 12 and 14 to each storage element 20 and 24 that is a level one storage element is computed. In the preferred embodiment, a breadth first search is used to make this determination.

As illustrated in block 78, for each data input, level one storage element pair, a setup time is computed according to the following equation:

$$\text{setup required} = \text{data}_{max} - \text{clock}_{min} + \text{setup time}_{pmd};$$

where $\text{data}_{max}$ is the previously computed maximum path delay from a particular data input to the level one storage device and $\text{clock}_{min}$ is the previously computed minimum delay from a particular clock input connector. Setup time$_{pmd}$ is the intrinsic setup time for the particular level one circuit element. $\text{Data}_{max} - \text{clock}_{min}$ represents the worst case where the clock precedes the data. The addition of the setup time of the device with the lag yields the required setup time for the element.

As previously described, the required setup time as described above is computed for each data input, level one storage pair. For a particular data input, the final setup requirement is the maximum of the setup requirement for each level one storage element coupled to that data input. The maximum setup requirement is determined by initializing a variable, setupmax, to 0, as illustrated in block 76, and comparing the setup values determined in block 78 for a particular data input, as illustrated in blocks 80 and 82. Block 84 branches back to block 78 if a particular data input is coupled to another level 1 element. If a particular data input is not coupled to any remaining level 1 elements, setupmax for that data input is stored as illustrated in block 86 and blocks 76–86 are repeated for each data input 12 and 14, as illustrated in block 88.

As illustrated in block 90, for each data input, level one storage element pair, a hold time is computed according to the following equation:

$$\text{hold required} = \text{clock}_{max} - \text{data}_{min} + \text{hold time}_{pmd};$$

where $\text{clock}_{max}$ is the previously computed maximum path delay from a particular clock input to the level one storage device and $\text{data}_{min}$ is the previously computed minimum delay from a particular data input connector to a level 1 storage element. Hold time$_{pmd}$ is the intrinsic hold time for the particular level one circuit element. $\text{Clock}_{max} - \text{data}_{min}$ represents the worst case where the data precedes the clock. The addition of the hold time of the device with the lag yields the required hold time for the element.

As previously described, the required hold time as described above is computed for each data input, level one storage pair. For a particular data input, the final hold requirement is the maximum of the hold requirement for each level one storage element coupled to that data input. The maximum hold requirement is determined by initializing a variable, holdmax, to 0, as illustrated in block 90 of FIG. 3d, and comparing the setup values determined in block 92 for a particular input connector, as illustrated in blocks 94 and 96. Block 98 branches back to block 92 if a particular data connector is coupled to another level 1 element. If a particular data input is not coupled to any remaining level 1 elements, holdmax for that data connector is stored as illustrated in block 100 and blocks 90–100 are repeated for each data input 12 and 14, as illustrated in block 102. The method is then finished since the required setup and hold times have been computed.

While the invention has been described in conjunction with the preferred embodiment, it is evident that numerous alternatives, modifications, variations and uses will be apparent to those skilled in the art in light of the foregoing description. For example, the required hold times may be calculated before the required setup times or a method other than a breadth first search may be used to calculate delays between nodes. Many other adaptations of the present invention are possible.

I claim:

1. A method for determining required setup times for a digital circuit, the digital circuit including data inputs, clock inputs and storage elements, said storage elements having an inherent setup time ($\text{Setup}_{pmd}$) said method comprising the steps of:

(a) performing a path tracing search to determine the minimum path delay from at least one clock input to at least one clock pin of a storage element in the integrated circuit ($\text{Clock}_{min}$);

(b) performing a path tracing search to determine the maximum path delay from at least one data input to at least one level one storage element ($\text{Data}_{max}$); and (c) determining the required setup time for a data input/ level one storage element pair from the expression:

$$\text{Data}_{max} - \text{Clock}_{min} + \text{Setup}_{pmd}.$$

2. The method of claim 1 wherein steps (a)–(c) are performed a plurality of times to determine the setup time for each level one storage element coupled to a particular data input, and further comprising the step of determining the maximum setup time from all of the determined setup times for the particular data input.

3. The method of claim 2 further comprising the step of determining the maximum setup time for each data input on the integrated circuit.

4. The method of claim 1 wherein said step of determining the minimum path delay from at least one clock input to at least one clock pin of a storage element in the integrated circuit ($\text{Clock}_{min}$) further includes the step of performing a breadth first search.

5. The method of claim 1 wherein said step of determining the maximum path delay from at least one data input to at least one level one storage element ($\text{Data}_{max}$) further includes the step of performing a breadth first search.

6. A method for determining required hold times for a digital circuit, the digital circuit including data inputs, clock inputs and storage elements, said storage elements having an inherent hold time ($\text{Hold}_{pmd}$) said method comprising the steps of:

(a) performing a path tracing search to determine the minimum path delay from at least one data input to at least one data pin of a storage element in the integrated circuit ($\text{Data}_{min}$);

(b) performing a path tracing search to determine the maximum path delay from at least one clock input to at least one level one storage element ($Clock_{max}$); and (c) determining the required hold time for a data input/level one storage element pair from the expression:

$$Clock_{max} - Data_{min} + Hold_{pmd}.$$

7. The method of claim 6 wherein steps (a)–(c) are performed a plurality of times to determine the hold time for each level one storage element coupled to a particular data input, and further comprising the step of determining the maximum hold time from all of the determined hold times for the particular data input.

8. The method of claim 7 further comprising the step of determining the maximum hold time for each data input on the integrated circuit.

9. The method of claim 6 wherein said step of determining the minimum path delay from at least one data input to at least one data pin of a storage element in the integrated circuit ($Data_{min}$) further includes the step of performing a breadth first search.

10. The method of claim 6 wherein said step of determining the maximum path delay from at least one clock input to at least one level one storage element ($Clock_{max}$) further includes the step of performing a breadth first search.

11. An apparatus for determining required setup times for a digital circuit, the digital circuit including data inputs, clock inputs and storage elements, said storage elements having an inherent setup time ($Setup_{pmd}$) said apparatus comprising:

minimum path determining means for performing a path tracing search to determine the minimum path delay from at least one clock input to at least one clock pin of a storage element in the integrated circuit ($Clock_{min}$);

maximum path determining means for performing a path tracing search to determine the maximum path delay from at least one data input to at least one level one storage element ($Data_{max}$); and setup time determining means for determining the required setup time for a data input/level one storage element pair by calculating $Data_{max} - Clock_{min} + Setup_{pmd}$, whereby said required setup time is determined.

12. The apparatus of claim 11 wherein:

said minimum path determining means further includes means for determining the minimum path delay from each clock input to each clock pin of a storage element in the integrated circuit ($Clock_{min}$) coupled to a particular data input;

said maximum path determining means further includes means for determining the maximum path delay from the particular data input to each level one storage element ($Data_{max}$); and said apparatus further comprises maximum setup time determining means for determining the maximum setup time from all of the determined setup times for the particular data input.

13. The apparatus of claim 12 wherein said maximum setup time determining means further comprises means for determining the maximum setup time for each data input on the integrated circuit.

14. The apparatus of claim 12 wherein said minimum path delay means further includes means for performing a breadth first search.

15. The method of claim 12 wherein said maximum path delay means further includes means for performing a breadth first search.

16. An apparatus for determining required hold times for a digital circuit, the digital circuit including data inputs, clock inputs and storage elements, said storage elements having an inherent setup time ($Hold_{pmd}$) said apparatus comprising:

maximum path determining means for performing a path tracing search to determine the maximum path delay from at least one clock input to at least one clock pin of a storage element in the integrated circuit ($Clock_{max}$);

minimum path determining means for performing a path tracing search to determine the minimum path delay from at least one data input to at least one level one storage element ($Data_{min}$); and hold time determining means for determining the required hold time for a data input/level one storage element pair by calculating $Clock_{max} - Data_{min} + Hold_{pmd}$, whereby said required hold time is determined.

17. The apparatus of claim 16 wherein:

said maximum path determining means further includes means for determining the maximum path delay from each clock input to each clock pin of a storage element in the integrated circuit ($Clock_{min}$) coupled to a particular data input;

said minimum path determining means further includes means for determining the minimum path delay from the particular data input to each level one storage element ($Data_{max}$); and said apparatus further comprises maximum hold time determining means for determining the maximum hold time out of all of the determined setup times for the particular data input.

18. The apparatus of claim 17 wherein said maximum hold time determining means further comprises means for determining the maximum hold time for each data input on the integrated circuit.

19. The apparatus of claim 16 wherein said maximum path delay means further includes means for performing a breadth first search.

20. The method of claim 16 wherein said minimum path delay means further includes means for performing a breadth first search.

* * * * *